United States Patent [19]

Lockwood

[11] Patent Number: 4,580,109

[45] Date of Patent: Apr. 1, 1986

[54] LOW NOISE OSCILLATOR

[75] Inventor: Larry R. Lockwood, McMinnville, Oreg.

[73] Assignee: Tektronix, Inc., Beaverton, Oreg.

[21] Appl. No.: 674,210

[22] Filed: Nov. 23, 1984

[51] Int. Cl.$^4$ ............................................. H03B 5/00
[52] U.S. Cl. ............................ 331/117 FE; 331/109; 331/183; 331/116 FE
[58] Field of Search ..................... 331/46, 109, 116 R, 331/116 FE, 107 DP, 107 SL, 117 R, 117 D, 117 FE, 158, 167, 183; 333/219, 227; 307/264; 330/277

[56] References Cited

U.S. PATENT DOCUMENTS 3,996,530 12/1976 Feistel et al. .................. 331/109 X

FOREIGN PATENT DOCUMENTS 1295681 5/1969 Fed. Rep. of Germany ... 331/116 R

*Primary Examiner*—Eugene R. LaRoche
*Assistant Examiner*—Robert J. Pascal
*Attorney, Agent, or Firm*—William A. Birdwell; Francis I. Gray

[57] ABSTRACT

A circuit configuration is provided for reducing noise sidebands in the output of an oscillator due to modulation of the oscillation signal by characteristic noise produced by the amplifying element. A gallium arsenide field-effect transistor that produces characteristic noise is operated as a linear amplifier. Positive feedback to the input of the amplifier is provided by a resonator. The amplitude of the oscillation signal is limited by a distinct limiting circuit in the feedback loop, the input to which is isolated from the amplifier by a high pass filter, thereby divorcing the non-linear limiting function of the oscillator from the amplifying function where noise is generated.

10 Claims, 5 Drawing Figures

LOW NOISE OSCILLATOR

BACKGROUND OF THE INVENTION

This invention relates to low noise oscillators, particularly microwave oscillators employing a gallium arsenide field-effect transistor as an amplifying element.

The gallium arsenide field-effect transistor (GaAs FET) is especially suitable for use as a microwave amplifier because its parameters are relatively less variable as a function of operating conditions and its impedance is generally higher than in comparable bipolar devices. This results in wider bandwidth, lower noise, and higher linearity. However, a problem is encountered in the use of a GaAs FET as an oscillator due to characteristic noise that is inordinately high in the GaAs FET. The noise is apparently a result of inherent physical phenomona within the device, and its amplitude is approximately an inverse function of frequency. That is, the noise is approximately equal to 1/f, where f=frequency of examination for noise. This noise, which is generated primarily between the gate and the source of the FET, is in addition to normal thermal noise generated in all circuits.

While the aforementioned characteristic noise is of little concern where a GaAs FET is used as a linear microwave amplifier, since the noise is easily filtered out by a high pass filter, in an oscillator it results in spectral impurity of the output. This is because the amplifying element of an oscillator ordinarily performs a limiting function to maintain the oscillator signal at constant amplitude. The limiting function necessarily causes the amplifier to operate to some degree in a non-linear manner; hence, modulation of the oscillation signal by the noise signal components occurs. As a result, the oscillator output includes noise sidebands whose amplitudes vary inversely with the difference in frequency between the frequency of oscillation and the frequency of the examination.

Conventional solutions to this problem have been, for example, to employ a phase-locked loop or a higher Q (quality factor) circuit to increase spectral purity of the oscillator signal. However, such circuits have limits as to their effectiveness and unduly increase the complexity of the oscillator. Accordingly, it would be desirable to have a simple, but effective, circuit configuration that eliminates the effect of characteristic noise in a GaAs FET oscillator.

SUMMARY OF THE INVENTION

In order to overcome the limitations of GaAs FET devices in oscillators, particularly microwave oscillators, the present invention provides an oscillator circuit configuration wherein the amplitude limiting function of the oscillator is divorced from the amplifying function. A GaAs FET amplifier is operated in the linear mode. A limiting circuit is placed in the oscillator's feedback circuit and separated from the amplifier by a high pass filter which allows the high frequency oscillation signal to be fed back to the input of the amplifier while blocking the low frequency noise produced by the FET from reaching the limiting circuit and modulating the oscillation signal.

The GaAs FET amplifier is provided with a resistive biasing load connected from the FET drain to the supply voltage. The drain is also capacitively coupled to a tuned circuit, or resonator, which is also capacitively coupled to the gate of the FET, thereby providing positive feedback at the frequency of oscillation. A resistor is connected from the gate to supply common for input biasing. A diode bridge limiting circuit is coupled from supply common to the source of the FET through a capacitor. Positive and negative current limits on the amplitude of the signal are provided by connecting the bridge to respective reference voltages through respective resistors. The source is also connected to supply common through an inductor. The capacitor between the source and the limiter and the inductor between the source and supply common serve as a high pass filter blocking the characteristic FET noise.

Accordingly, it is a principal object of the present invention to provide a novel low noise oscillator.

It is another principal advantage of the present invention to provide a low noise oscillator wherein the amplifying element is a GaAs FET.

It is yet another object of the present invention to provide a low noise oscillator wherein the amplitude limiting function of the oscillator is divorced from the amplifying function.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
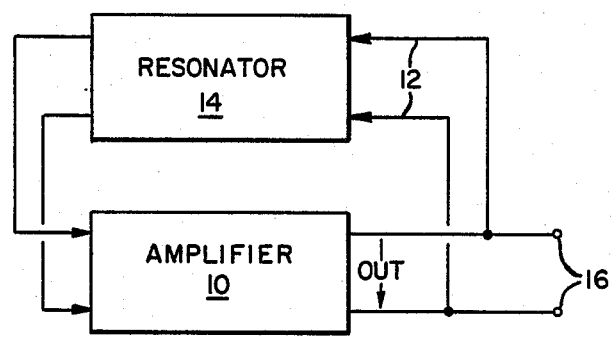
FIG. 1 shows a block diagram of a conventional oscillator circuit.

As shown in FIG. 1, a conventional microwave oscillator employs an amplifier 10 having a feedback loop 12 including a resonator 14 for providing positive feedback at the frequency of oscillation. That is, at that frequency the feedback through the resonator is maximized and in phase with the input signal to the amplifier. In such an oscillator configuration the amplitude of the oscillation signal is limited by the amplifier itself, the open loop gain of the amplifier and feedback circuit being greater than one in order to start and sustain oscillation in a practical circuit. Hence, the amplifier must, to some degree, operate in a non-linear manner. As a result, any signal components, such as noise, passing through the amplifier will modulate the oscillation signal, resulting in a signal at output 16 having unwanted frequency components, that is, noise sidebands.

Figure 2A:
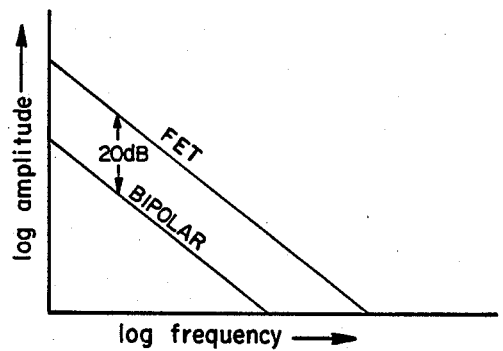
FIG. 2a shows a graph of noise as a function of frequency of examination for bipolar and field-effect transistors.

In FIG. 2a the amplitude of characteristic noise produced by a gallium arsenide field-effect transistor as a function of the frequency of examination is compared to the amplitude of characteristic noise produced by a bipolar transistor. As is illustrated by that graph, the additional noise produced by a GaAs FET is typically about 20 dB higher than for a bipolar transistor. The amplitude of the characteristic noise is approximately inversely proportional to the frequency of examination; thus, it drops off at about 3 dB per octave.

Figure 2B:
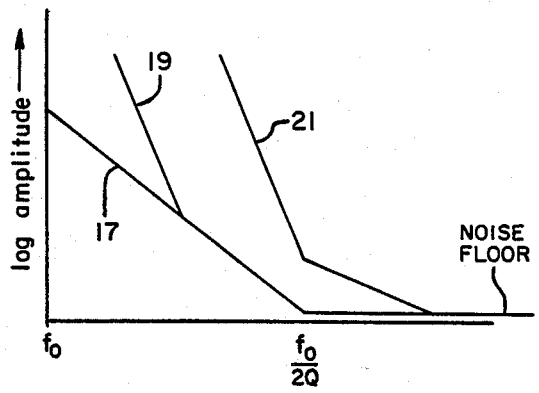
FIG. 2b shows the effect of characteristic noise on the spectral purity of an oscillator.

The effect of such noise on the spectral purity of the oscillator output is shown in FIG. 2b. In the absence of characteristic noise the spectral purity of the output signal is degraded by thermal noise. The amplitude of thermal noise sidebands, represented by line 17, drops off at about 6 dB per octave, the level of the noise itself, i.e., the noise floor, exceeding the oscillator output level beyond about $\pm f_o/2Q$, where:

$f_o$ = frequency of oscillation
$Q$ = quality factor of the resonator.

Line 19 represents the total of thermal and characteristic noise level for a bipolar transistor. As can be seen by line 19, at some frequency less than $f_o/2Q$ away from $f_o$, the noise level for a bipolar transistor begins to rise at about 9 dB per octave. Line 21 represents the total of thermal and characteristic noise level for a GaAs FET. In this case, since the GaAs FET noise is 20 dB higher than the bipolar noise, the spectral width of the signal is pushed out beyond $\pm f_o/2Q$. Thus, in the absence of some means for preventing the characteristic noise of a GaAs FET from modulating the oscillation signal, frequency components on either side of the frequency of oscillation are increased both in amplitude and spectral breadth.

Figure 3:
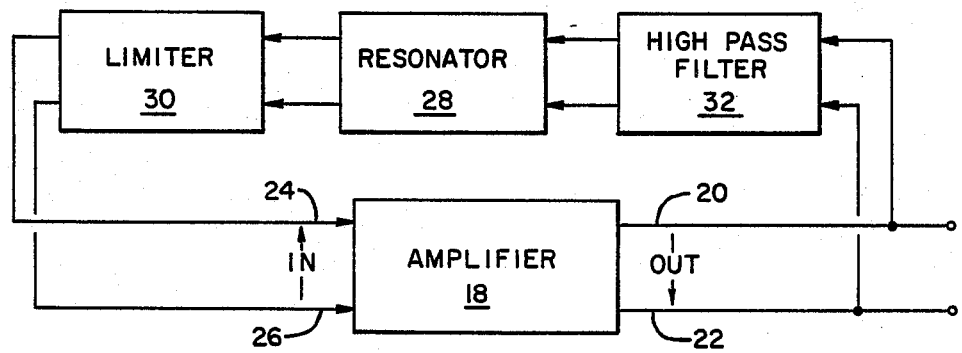
FIG. 3 shows a block diagram of a low noise oscillator according to the present invention.

Turning now to FIG. 3, the oscillator of the present invention employs an amplifier 18 biased to operate at all times in a linear mode. The amplifier is provided with an output port having an inverting output 20 and a non-inverting output 22. It is also provided with an input port having an inverting input 24 and a reference input 26. The amplitude of the inverting output 20 changes inversely in relation to the inverting input 24. Although the invention is directed to the use of an amplifying element comprising a GaAs FET because of the noise characteristics peculiar to that device, it is to be recognized that other amplifying devices might be employed advantageously without departing from the principles of the invention.

Positive feedback at the frequency of oscillation of the amplifier in order to sustain oscillation is produced by a resonator, or tuned circuit, 28. Typically, at the frequency of oscillation the resonator produces a 180 degree phase shift in the feedback signal so that the feedback signal is in phase with the input to the amplifier; that is, if the feedback loop were opened at the input to the amplifier and a signal at the frequency of oscillation were applied to the input, the output from the resonator 22 would be in phase with that signal. The resonator also ensures that the feedback signal is at a maximum only at that frequency.

To maintain the effective amplifier and feedback loop gain of the oscillator at substantially one, and thereby provide a constant oscillator output amplitude, the oscillator is provided with an amplitude limiter 30. Because the limiter places a limit on the amplitude of the signal passing through it, the circuit is necessarily non-linear.

To prevent the non-linearity of the limiter 30 from causing modulation of the oscillation signal by the characteristic noise of the amplifying device, the oscillator is provided with a high pass filter 32. Since the characteristic noise decreases with frequency, it is only relatively low frequency noise that is of practical concern. The high pass filter blocks characteristic noise produced by the amplifier 18 from reaching the limiter 30, and thereby prevents the limiter from modulating the input to the amplifier by that noise. It is to be understood that the limiter 30 may be placed anywhere in the feedback loop, provided that a high pass filter is provided to prevent low frequency noise from reaching the limiter.

Figure 4:
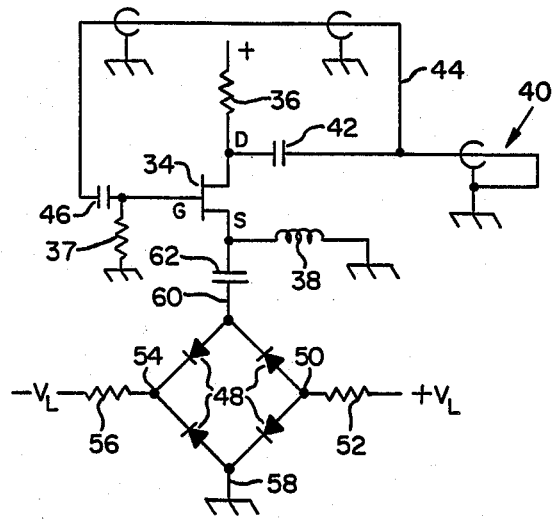
FIG. 4 shows a schematic diagram of a preferred embodiment of an oscillator according to the present invention.

In the preferred embodiment shown in FIG. 4 the amplifier comprises a GaAs FET 34, having a biasing load resistor 36 connected from a positive power supply to the drain D of the FET, an input biasing resistor 37 connected from the gate G to power supply common, and an inductor 38 connected from the source S to power supply common. The gate of the FET may be viewed as an inverting input to the amplifier, the power supply common as a reference input to the amplifier, the drain of the FET as the inverting output of the amplifier, and the source of the FET as the non-inverting output of the amplifier.

Since the circuit of the preferred embodiment is intended for microwave frequencies, the resonator 40 typically comprises a loop device having capacitive and inductive characteristics of a tuned circuit. It is coupled to the drain of the FET by a capacitor 42 and to the gate of the FET by a capacitor 46, so as to avoid interference with the DC biasing of the transistor.

In this case the limiter is placed in the non-inverting loop of the feedback circuit. The limiter comprises a conventional limiter having four diodes 48 in a bridge configuration. The top 50 of the bridge is connected through a resistor 52 to a positive limiting voltage $+L_L$ and the bottom 54 of the bridge is connected through a resistor 56 to a negative limiting voltage $-V_L$. The diodes 48 are therefore ordinarily forward biased. A first side 58 of the bridge is connected to supply common and the other side 60 of the bridge is coupled through a capacitor 62 to the source, or non-inverting output, of the FET. Capacitor 62 prevents the bridge from interfering with the DC biasing of the transistor.

Resistors 52 and 56 have relatively high resistance, e.g. 15K ohms, as compared to the forward biased impedance of the diodes, e.g. about 54 ohms. Hence, as the oscillator signal applied to side 60 of the bridge goes positive it will be passed to the first side 58 through all four diodes until it exceeds the forward biasing current in the diodes. At that point only the diode between side 60 of the bridge and the bottom 54 of the bridge will continue to conduct significantly, so the signal will experience the relatively high impedance presented by resistor 56 thereby limiting the signal current. As the signal goes sufficiently negative to exceed the forward biasing current in the diodes its current will be similarly limited by the impedance of resistor 52.

Most of the characteristic noise of the FET is generated at the source thereof. The object is to prevent that noise from reaching the input through the non-inverting feedback loop. This is accomplished by capacitor 62 and inductor 38, connected between the source and power supply common, which not only isolate the DC biasing from the AC signal path, but act as a high pass filter to prevent the low-frequency characteristic noise generated at the source from reaching the limiter and modulating the oscillator signal.

It is to be recognized that while a specific circuit has been shown as the preferred embodiment of the invention, other circuit configurations could be utilized without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

I claim:

1. An electronic oscillator, comprising:
   (a) amplifier means, having an input port and an output port, for producing at said output port an output signal that is an amplified representation of an input signal applied to said input port;
   (b) resonator means, coupled between said output port and said input port, for producing a feedback signal having maximum amplitude only at a first predetermined frequency;
   (c) limiter means, coupled between said out put port and said input port, for causing said feedback signal to be limited to a predetermined maximum amplitude; and
   (d) high pass filter means for attenuating signal components supplied to said limiter means below a second predetermined frequency, the loop gain from said input port through said amplifier means, said resonator means, said limiter means, and said high pass filter means being substantially about one at said first predetermined frequency.

2. The oscillator of claim 1 wherein said output signal is a substantially linear representation of said input signal.

3. The oscillator of claim 1 wherein said input port has an inverting input and a reference input, and said output port has an inverting output whose signal level changes inversely with respect to said inverting input and a non-inverting output, said limiter means comprising a limiting circuit coupling said non-inverting output to said reference input, and said resonator means comprises a tuned circuit coupled from said inverting output to said inverting input.

4. The oscillator of claim 3 wherein said limiting circuit comprises a diode bridge-type limiting circuit.

5. The oscillator of claim 1 wherein said limiter means comprises a diode bridge-type limiting circuit.

6. The oscillator of claim 1 wherein said amplifier means comprises a transistor having an inverting input connection, an inverting output connection coupled to a power supply potential, and a non-inverting output connection, said resonator means comprises a tuned circuit capacitively coupled between said inverting output connection and said inverting input connection, and said limiter means comprises a diode bridge, one side of said bridge being connected to a power supply common potential and the other side of said bridge being coupled by a filter capacitor to said non-inverting output connection, the top and bottom of said bridge being connected through respective resistors to respectively distinct potentials such that the diodes of said bridge are ordinarily forward biased, said resistors having a high resistance relative to the forward-biased impedance of said diodes.

7. The oscillator of claim 6 further comprising an inductor connected between said non-verting output connection and said power supply common, potential, said filter capacitor and said inductor serving as a high pass filter between said non-inverting output connection and said diode bridge.

8. The oscillator of claim 6 wherein said transistor comprises a gallium arsenide field-effect transistor, said inverting input connection being the gate thereof, said inverting output connection being the drain thereof, and said non-inverting output connection being the source thereof.

9. The oscillator of claim 1 wherein said amplifier means comprises a gallium arsenide field-effect transistor amplifier.

10. A method of reducing noise in the output of an oscillator having an amplifying element that tends to produce noise whose amplitude is substantially inversely proportional to the frequency of examination, comprising:
    (a) operating said amplifying element in a linear mode;
    (b) limiting the amplitude of oscillation-inducing feedback by a limiting circuit distinct from said amplifying element; and
    (c) filtering the feedback applied to said limiting circuit so as to attenuate signal components below a predetermined frequency.

* * * * *